(12) United States Patent
Jung et al.

(10) Patent No.: US 6,728,299 B2
(45) Date of Patent: Apr. 27, 2004

(54) TRANSMITTER GAIN CONTROL FOR CDMA SIGNALS

(75) Inventors: Gillyoung Jung, San Diego, CA (US); Nick Carbone, San Diego, CA (US); Jean-Marie Tran, San Diego, CA (US)

(73) Assignee: Nokia Corporation, Espoo (FI)

( * ) Notice: Subject to any disclaimer, the term of this patent is extended or adjusted under 35 U.S.C. 154(b) by 90 days.

(21) Appl. No.: 10/184,445

(22) Filed: Jun. 28, 2002

(65) Prior Publication Data

US 2004/0001558 A1 Jan. 1, 2004

(51) Int. Cl.[7] .............................. H04B 1/69; H04K 1/02
(52) U.S. Cl. ........................................ 375/146; 375/297
(58) Field of Search ................................ 375/295, 296, 375/297, 130, 146, 285, 144; 330/250

(56) References Cited

U.S. PATENT DOCUMENTS

| | | | | | |
|---|---|---|---|---|---|
| 5,029,182 A | * | 7/1991 | Cai et al. | ................ | 375/136 |
| 5,862,460 A | * | 1/1999 | Rich | .................... | 455/116 |
| 5,930,230 A | * | 7/1999 | Odenwalder et al. | ....... | 370/208 |
| 5,949,814 A | * | 9/1999 | Odenwalder et al. | ....... | 375/140 |
| 6,173,007 B1 | * | 1/2001 | Odenwalder et al. | ....... | 375/146 |
| 6,242,975 B1 | * | 6/2001 | Eidson et al. | ........... | 330/124 R |
| 6,501,787 B1 | * | 12/2002 | Odenwalder et al. | ....... | 375/147 |
| 6,519,705 B1 | * | 2/2003 | Leung | ................ | 713/300 |
| 6,535,496 B1 | * | 3/2003 | Odenwalder et al. | ....... | 370/335 |
| 6,549,525 B2 | * | 4/2003 | Odenwalder | .............. | 370/332 |
| 6,591,089 B1 | * | 7/2003 | Ichihara | ................ | 455/115.3 |

* cited by examiner

*Primary Examiner*—Tesfaldet Bocure

(57) ABSTRACT

A method, system, and computer program product for controlling amplification of an input transmit signal in a transmitter in order to operate a digital-to-analog converter such that its clipping point corresponds to a desired cumulative distribution level. The input transmit signal is coupled to a digital-to-analog converter and includes a plurality of independent spread spectrum channels. The spread spectrum channels have associated individual channel gains. The invention includes an approximating the total variance of the input transmit signal and determining an amplification gain corresponding to the desired cumulative distribution level using an amplification function dependent on the total variance of the input transmit signal.

20 Claims, 4 Drawing Sheets

TRANSMITTER GAIN CONTROL FOR CDMA SIGNALS

FIELD OF THE INVENTION

The present invention relates generally to radio communication, and more specifically to a system for adjusting the gain of a transmit signal to an optimal level for a desired cumulative distribution level.

BACKGROUND

A communication system is formed, at a minimum, of a sending station and a receiving station interconnected by way of a communication channel. Information generated at the sending station is communicated to the receiving station over the communication channel. A wide variety of different types of communication systems have been developed and are regularly utilized to effectuate communication of information between sending and receiving stations.

Advancements in communication technologies have permitted the development and construction of new types of communication-systems. A radio communication system is exemplary of a type of communication system which has benefited from advancements in communication technologies. A communication signal formed between the sending and receiving stations of a radio communication system is defined over a radio link. Because a radio link is utilized to form the communication signal, the conventional need of wireline connections between the sending and receiving stations is obviated. Thus, increased mobility is inherent in a radio communication system in contrast to a conventional wireline system.

The communication capacity of a radio communication system, however, is sometimes constricted as a result of bandwidth limitations. Only a limited amount of the electromagnetic spectrum is typically allocated to be used by a particular radio communication system and upon which communication channels can be defined. Communication capacity increase of a radio communication system is, therefore, sometimes limited by such allocation of bandwidth. Increase of the communication capacity of the radio communication system, therefore, is sometimes only possible by increasing the efficiency by which the allocated spectrum is used.

Digital communication techniques are among the advancements in communication technologies which have advantageously been implemented in various communication systems. Digital communication techniques permit the bandwidth efficiency of communications over a communication channel in a communication system to be increased. Due to the particular need to efficiently utilize the bandwidth allocated in a radio communication system, the use of such digital techniques is particularly advantageously utilized in a radio communication system.

An important operation in digital communications is transforming a digital transmit signal into an analog transmit signal. A digital-to-analog converter (DAC) is typically used to perform such a transformation. The DAC obtains the digital signal over a discrete number of bits and outputs an analog representation of the signal. Since the DAC uses a finite number of bits, care must be taken that the input digital signal does not exceed the full-scale limit of the DAC. If the digital input signal increases beyond the DAC's maximum output value, the analog signal remains at the maximum value, even though the digital signal is greater than the corresponding analog value. Such a situation is often referred to as "clipping" because the peaks of the digital signal are flattened to the maximum value of the DAC in the corresponding analog signal.

Clipping can result in signal degradation, poor adjacent channel power ratio (ACPR), and information loss. One way to avoid clipping is to control the amplification level of the digital transmit signal so that the full-scale limit of the DAC is never reached.

Avoiding any amount of signal clipping, however, can often increase quantization errors inherent in DACs; especially if the peaks of the digital signal are infrequent and much greater than the average transmit signal amplitude. This is because less of the DAC's resolution is devoted to the most prevalent portion of the input digital signal. Quantization errors in digital communication systems can often lead to signal distortion and poor signal-to-noise ratios. Thus, it may be advantageous to strike a careful balance between some amount of clipping and some degree of quantization error in the digital transmit signal of CDMA communication systems.

SUMMARY OF THE INVENTION

Accordingly, the present invention provides a method, system and computer program for controlling the gain of a spread spectrum transmit signal such that a desired cumulative distribution level of the signal is associated with the full-scale limit of the DAC.

One aspect of the present invention is a method for controlling the amplification of an input transmit signal at a desired cumulative distribution level in a transmitter. The input transmit signal is coupled to a digital-to-analog converter and includes a plurality of independent spread spectrum channels. The spread spectrum channels have associated individual channel gains. The method includes an approximating operation to approximate the total variance of the input transmit signal. A determining operation determines an amplification gain corresponding to the desired cumulative distribution level using an amplification function dependent on the total variance of the input transmit signal.

Another aspect of the invention is a system for controlling the amplification gain of an input transmit signal in order to operate at a desired cumulative distribution level in a radio transmitter. The input transmit signal includes a plurality of independent spread spectrum channels, with the spread spectrum channels having individual channel gains. The system includes an amplifier receiving the input transmit signal and outputting an amplified transmit signal. The amplifier is configured to amplify the input transmit signal in response to a gain control signal. A digital-to-analog converter is coupled to the amplified transmit signal, and a gain control unit is coupled to the gain control signal. The gain control unit is configured to approximate a total variance of the input signal and to adjust the gain control signal based on an amplification function dependent on the total variance of the input transmit signal.

Yet a further aspect of the invention is a computer program for controlling amplification of an input transmit signal in a transmitter in order to operate at a desired cumulative distribution level. The input transmit signal is coupled to a digital-to-analog converter and includes a plurality of independent spread spectrum channels. The spread spectrum channels have individual channel gains. The computer program is configured to approximate a total variance of the input transmit signal and determine an amplification gain corresponding to the desired cumulative distribution level using an amplification function dependent on the total variance of the input transmit signal.

The foregoing and other features, utilities and advantages of the invention will be apparent from the following more particular description of various embodiments of the invention as illustrated in the accompanying drawings.

DETAILED DESCRIPTION OF THE INVENTION

Figure 1:
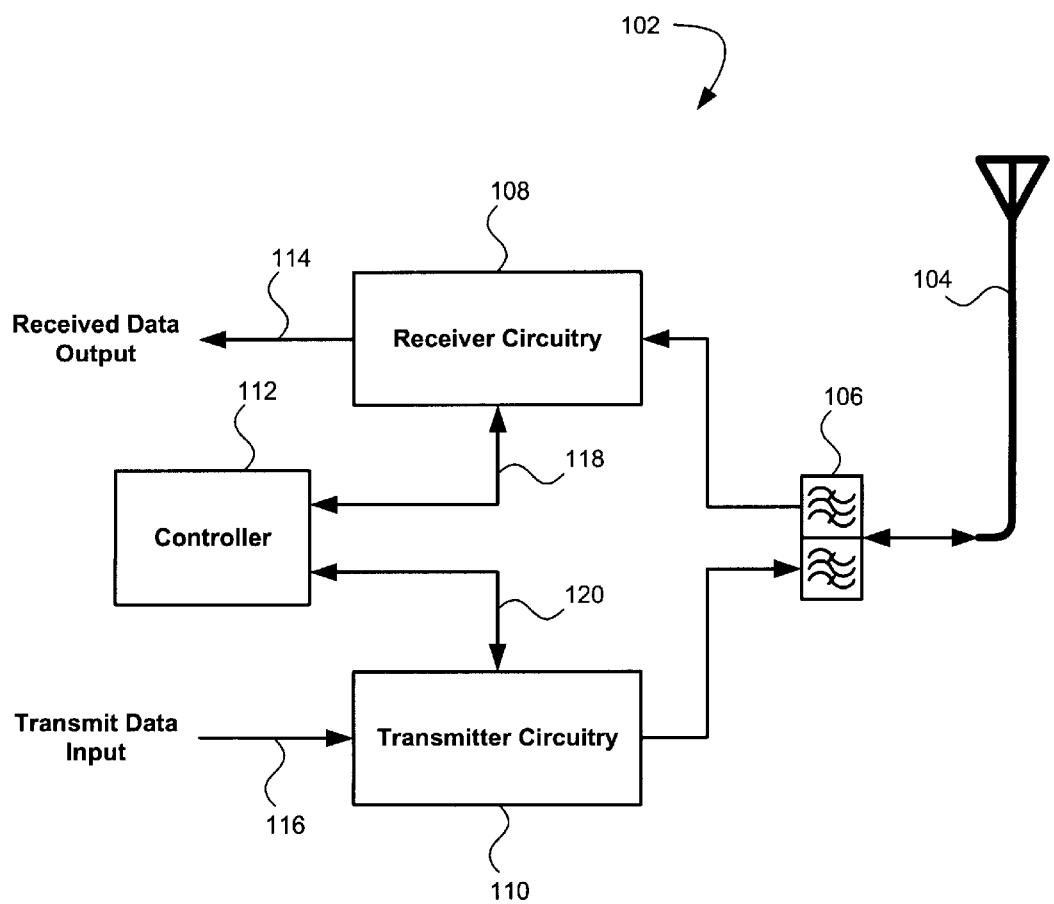
FIG. 1 shows a block diagram of an exemplary transceiver circuitry for use in a mobile unit embodying the present invention.

As detailed below, the present invention is a method, system and computer program for controlling the gain of a spread spectrum transmit signal such that a desired cumulative distribution level of the signal is set to correspond to the full-scale amplitude of the digital-to-analog converter (DAC). The invention is described with reference to FIGS. 1–4. When referring to the figures, like structures and elements shown throughout are indicated with like reference numerals.

FIG. 1 shows a block diagram of an exemplary receiver and transmitter (transceiver) circuitry 102 for use in a mobile unit embodying the present invention. The transceiver circuitry 102 includes receiver circuitry 108 and transmitter circuitry 110. In a CDMA implementation, the receiver circuitry 108 operates to amplify relatively weak downlink signals received at the antenna 104 from a base station, to despread CDMA channels contained in the received downlink signals, and to output a resultant signal 114 containing despread data. For example, the signal 114 may contain a digitized voice signal. Additionally, the receiver circuitry 108 outputs a signal 118 to a control processor 112. The control processor 112 may include a micro-controller or microprocessor configured by data in read-only and/or random access memory to control operation of the mobile unit. The signal 114 between the controller 112 and the receiver circuitry 108 may include spread or despread data, a pilot channel signal, control data, such as power control bits, or other information associated with a received channel.

The transceiver circuitry 102 also includes transmitter circuitry 110 coupled to the control processor 112. The control processor 112 may send a signal 120 to control the gain of the transmitter circuitry 110 and to control the establishment of channels between the mobile unit and the base station. The transceiver circuitry 102 may also include a duplexer 106 that helps minimize reflections of signals sent by the transmitter circuitry 110 to the antenna 104, and from signals sent to the receiver circuitry 108 from the antenna 104. In a typical arrangement, the transceiver circuitry 102 will be further coupled to voice and data signal processing circuitry. For example, the received data signal 114 may be a despread signal containing voice and data received from the base station. The signal 114 can be provided to a voice decoder circuit which converts the encoded voice into an audible form. A mobile unit can also include a voice encoder circuit which can digitally encode sounds received at a microphone and provide the digitally encoded data 116 to the transmitter circuitry 110 for CDMA spreading and transmission.

Figure 2:
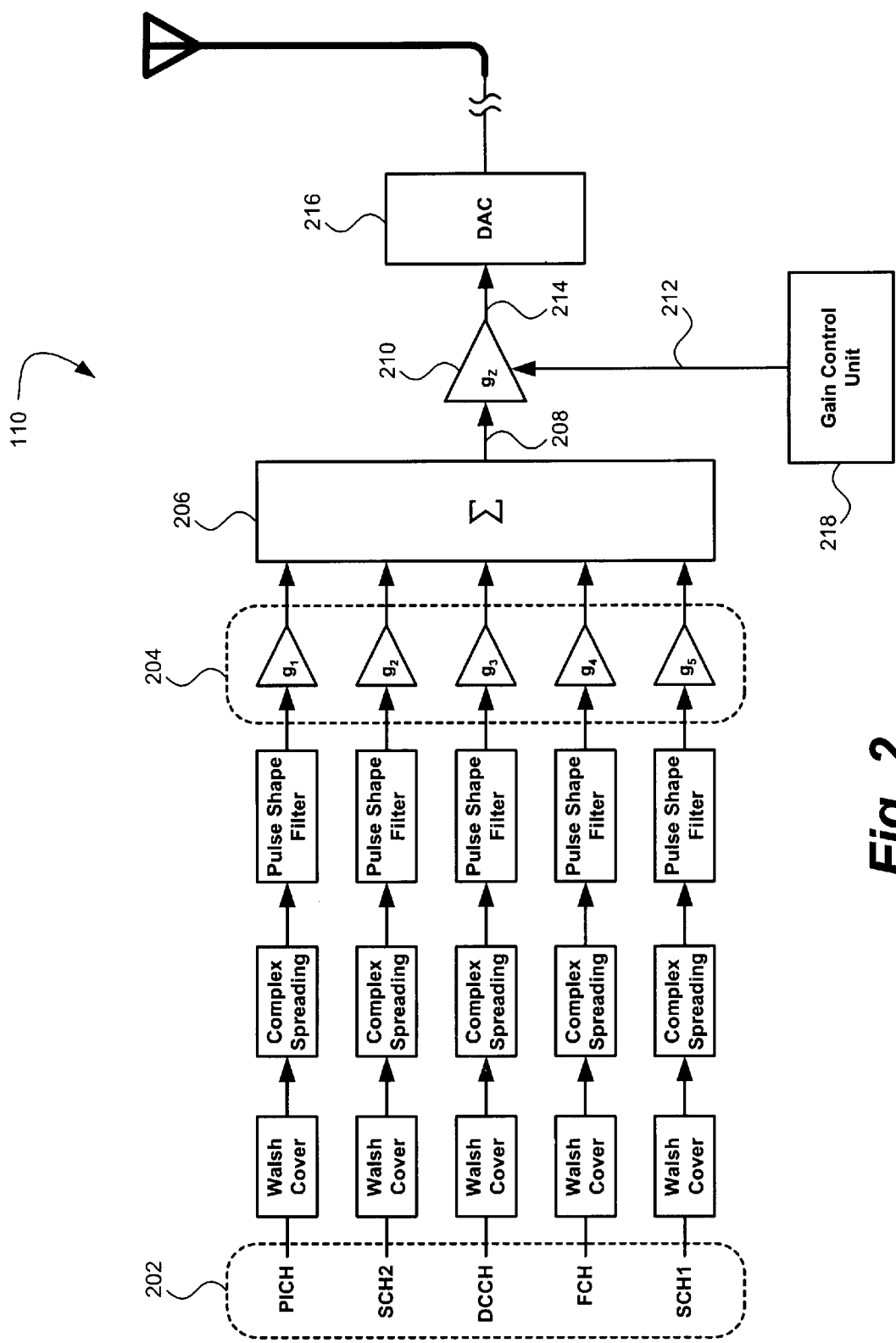
FIG. 2 shows an exemplary transmitter circuitry implementing the present invention.

FIG. 2 shows the exemplary transmitter circuitry 110 implementing the present invention in more detail. The transmitter circuitry 110 includes a plurality of channels 202 containing information to be transmitted by the by the mobile unit. For example, and pursuant to CDMA 2000 operational specifications, the channels 202 may include a data control channel (DCCH), a pilot channel (PICH), a fundamental channel (FCH), a first supplemental channel (SCH1), and a second supplemental channel (SCH2). It should be noted that the invention is not limited to such a channel configuration. It is contemplated that the invention may be utilized in transmitter circuits employing different channel types and different channel numbers as prescribed by various spread spectrum signal transmission techniques known in the art.

Each channel 202 is coded and spread in accordance with CDMA standards. For example, the transmitter circuitry 110 may use a Walsh Cover Unit, Complex Spreading Unit, and a Pulse Shape Filter Unit to produce individual spread spectrum channels. It is contemplated that other spread spectrum coding techniques known in the art may be employed with the present invention.

It is important to note at this point that once the spread spectrum channels are produced, each channel typically reaches its maximum amplitude over only a very small percentage of the signal. Each channel's variance can be measured using lab equipment or computer simulation and then stored in the mobile unit's memory. Furthermore, each channel's amplitude distribution can be approximated by a Gaussian distribution. Under this approximation, the total variance of multiple channels can be obtained by a sum of the variances for the individual channels. It should be observed that the Gaussian approximation does not conform exactly to the channel's true probability distribution. However, the approximation is useful in relating the total variance to the cumulative distribution function (CDF) of the combined channels, as discussed more fully below.

After each channel 202 is coded and spread, a set of digital amplifiers 204 amplify each spread spectrum channel at a separate channel gain $g_1, g_2, \ldots g_5$. Each channel gain can vary with respect to the pilot channel and change with time. In addition, the channel gains are dictated by the communication network, not the mobile unit. Thus, the transmitter circuitry 110 does not have control over the individual channel gains of the digital amplifiers 204, but is aware of their values.

Each amplified spread spectrum channel is input to a digital channel summer 206 which combines the separate channels into a single input transmit signal 208. The input transmit signal 208 is passed to a digital amplifier 210, where the magnitude of the transmit signal is adjusted. The digital amplifier gain $g_z$ is variable, and is controlled by a gain control signal 212. The digital amplifier 210 outputs an amplified transmit signal 214, and the amplified transmit signal 214 is coupled to a digital-to-analog converter (DAC) 216.

The DAC 216 converts the digital amplified transmit signal 214 to an analog signal. As discussed previously, the DAC 216 has a finite number of input bits to receive the amplified transmit signal 214. Because of the limited number of input bits, quantization errors are created by the DAC 216, leading to signal distortion and compromised signal-to-noise ratios in comparison to an infinite number of input bits. By increasing the digital amplifier gain $g_2$, the amount of quantization error can be reduced. However, increasing the digital amplifier gain $g_z$ such that the input signal exceeds the dynamic range of the DAC 216 will clip the amplified transmit signal 214 and can cause signal degradation, poor adjacent channel power ratio (ACPR), and information loss.

A gain control unit 218 coupled to the gain control signal 214 is configured to maintain an optimal digital amplifier gain $g_z$ operating point which optimizes between quantization errors and clipping problems. The gain control unit 218 first approximates the total variance of the input transmit signal 208. Since, as mentioned above, the dynamic range of the spread spectrum channels 202 can be approximated as independent Gaussian distributions, the total variance $\sigma_z^2$ of the input transmit signal 208 can be approximated using the equation:

$$\sigma_z^2 = g_1^2 \sigma_1^2 + g_2^2 \sigma_2^2 + \ldots + g_n^2 \sigma_n^2$$

where $g_1, g_2, \ldots g_n$ are the individual channel gains, and $\sigma_1^2, \sigma_2^2, \ldots \sigma_n^2$ are the variances of the spread spectrum channels 202.

Once the total variance is approximated, the gain control unit 218 calculates a peak amplitude value using an amplification function. The amplification function is dependent on the total variance, and is derived from cumulative distribution simulation of different total variance values.

Figure 3:
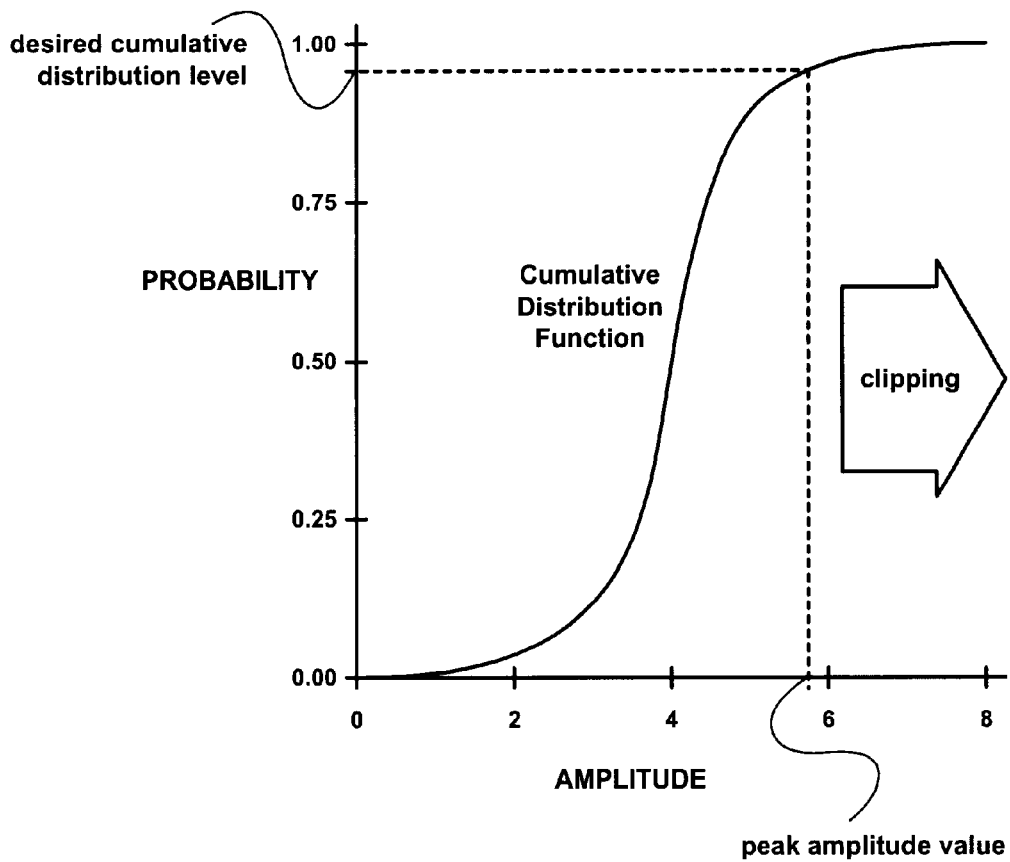
FIG. 3 shows an exemplary cumulative distribution function of an input transmit signal at a particular total variance.

To better describe how the amplification function is derived, reference is now made to FIG. 3. In FIG. 3, an exemplary cumulative distribution function of the input transmit signal at a particular total variance is shown. It should be noted that since the channel gains $g_1, g_2, \ldots g_5$ can change over the operation of the transmitter, FIG. 3 represents only a snapshot in time of the input transmit signal's cumulative distribution.

A cumulative distribution function is defined as:

$$f(x) = Pr[X \leq x]$$

where Pr is the probability that a variable X takes a value less than or equal to x. In connection with the present invention, a desired cumulative distribution level is selected for the input transmit signal. The desired cumulative distribution level selected is based on experimental and/or simulation results yielding optimal signal transmission results. In a particular embodiment of the invention, the desired cumulative distribution level is 99.9%. Once a desired cumulative distribution level is selected, the cumulative distribution function is used to determine a peak amplitude value. The peak amplitude value is the point at which clipping of the amplified transmit signal should occur.

As mentioned above, the cumulative distribution curve shown in FIG. 3 is but a snapshot of many possible cumulative distribution curves of the input transmit signal. Thus, the above procedure is repeated for different total variance values. The resulting peak amplitude values for different total variances at the desired cumulative distribution level are collected and an amplification function is created using curve fitting techniques known in the art. In one embodiment of the invention, the amplification function is a function of the total variance. For example, the amplification function may be a polynomial or trigonometric function of the total variance. In another embodiment of the invention, a peak amplitude value lookup table based on the total variance can be created.

Referring back to FIG. 2, once an amplification function is created, the gain control unit 220 regulates the gain control signal 212 using the equation:

$$g_z \approx \frac{DAC \text{ full-scale level}}{\text{peak amplitude value}}$$

where $g_z$ is proportional to the DAC full-scale level and inversely proportional to the peak amplitude value. At this amplification gain setting, the input transmit signal 208 is clipped by the DAC 216 when it rises above the peak amplitude value.

Figure 4:
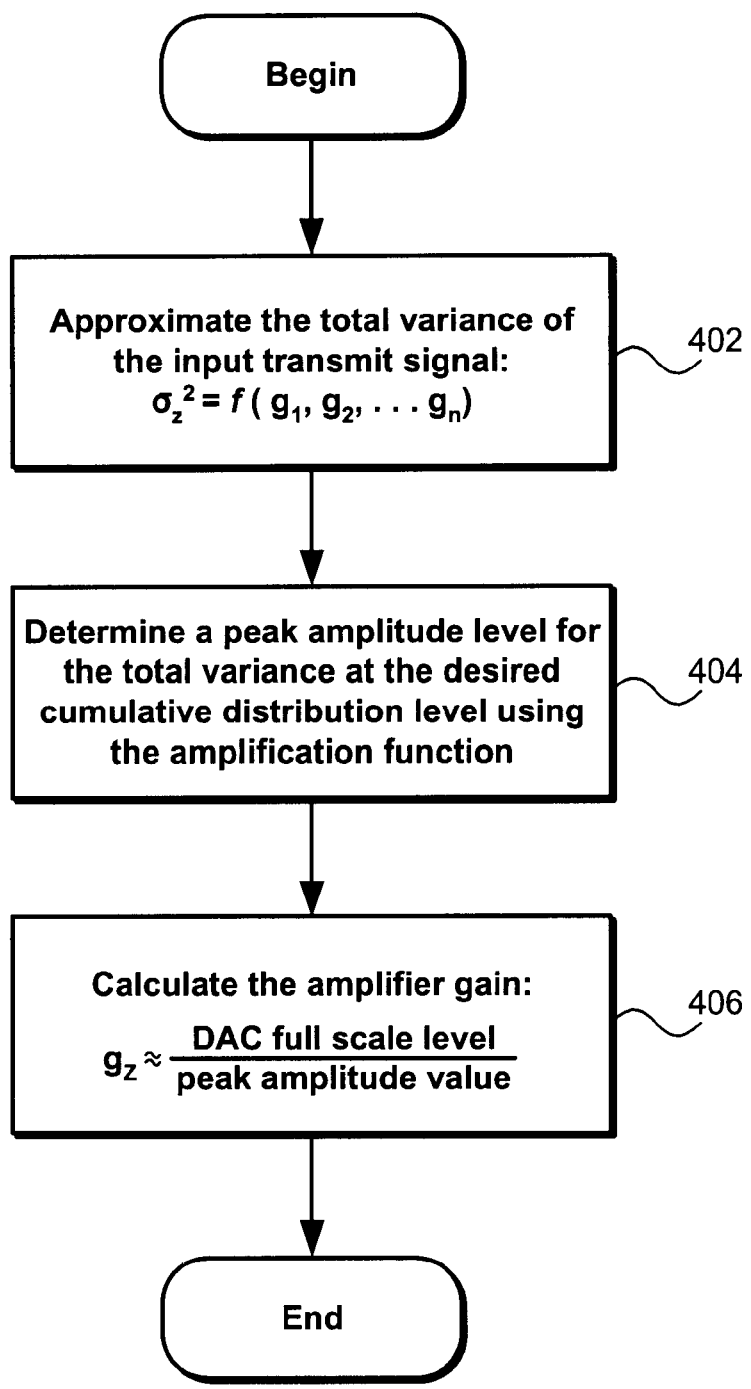
FIG. 4 shows a flowchart of an exemplary method, in accordance with the present invention, for controlling input transmit signal amplification.

In FIG. 4, a flowchart of an exemplary method for controlling input transmit signal amplification such that the clipping point of a DAC corresponds to a desired cumulative distribution level, in accordance with the present invention, is shown. It should be remarked that the logical operations of the flowchart may be implemented (1) as a sequence of computer executed steps running on a computing system and/or (2) as interconnected machine modules within the computing system. The implementation is a matter of choice dependent on the performance requirements of the system implementing the invention. Accordingly, the logical operations making up the embodiments of the present invention described herein are referred to alternatively as operations, steps, or modules.

At approximating operation 402, the total variance of the input transmit signal is estimated. As described above, the total variance of the input transmit signal is determined by first approximating the amplitude function of each of the spread spectrum channel in the input transmit signal as a Gaussian distribution. By doing so, the total variance of the input transmit signal $\sigma_z^2$ is calculated using the equation:

$$\sigma_z^2 = g_1^2 \sigma_1^2 + g_2^2 \sigma_2^2 + \ldots g_n^2 \sigma_n^2$$

where $g_1, g_2, \ldots + g_n$ are the known individual gains of the spread spectrum channels, and $\sigma_1, \sigma_2, \ldots \sigma_n$ are the known variances of the spread spectrum channels making up the input transmit signal. Once the variance of the input transmit signal is approximated, control passes to determining operation 404.

At determining operation 404, the peak amplitude level for a desired cumulative distribution level is determined using an amplification function. The amplification function, as discussed above, is derived through transmit signal simulation and curve fitting techniques. The peak amplitude level is an optimal level above which the input transmit signal should be clipped. For example, based on the Gaussian approximation, the value $3\sigma_2$ corresponds to the 99.9% cumulative distribution level. For channels that are not precisely Gaussian, the 99.9% cumulative distribution level can be estimated as some other simple function of $\sigma_z$ and the channel gains. Once the determining operation 404 is completed, control passes to calculating operation 406.

In calculating operation 406, the amplification gain ($g_z$) of the input transmit signal is computed. The amplification gain is proportional to the DAC full-scale level and inversely proportional to the peak amplitude value.

The foregoing description of the invention has been presented for purposes of illustration and description. It is not intended to be exhaustive or to limit the invention to the precise form disclosed, and other modifications and variations may be possible in light of the above teachings. For example, the architecture of the transmitter circuitry was chosen because it clearly illustrates that the separate channels are independent Gaussian channels. Other circuit architectures, however, may be used with the present invention. For instance, only one pulse shaping filter may be employed after the summing junction. In this case, the output of the single pulse shape filter would be Gaussian for each channel independently, and the variance of each channel could be determined by operating each channel independently. Thus, the sum of the channels can still be considered a sum of Gaussian random variables. Thus, the embodiments disclosed were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for controlling amplification of an input transmit signal coupled to a digital-to-analog converter in a transmitter in order to operate the digital-to-analog converter such that its clipping point corresponds to a desired cumulative distribution level, the input transmit signal including a plurality of spread spectrum channels, the spread spectrum channels having individual channel gains, the method comprising:

approximating a total variance of the input transmit signal; and determining an amplification gain corresponding to the desired cumulative distribution level using an amplification function dependent on the total variance of the input transmit signal.

2. The method of claim 1, wherein the amplification function is derived from simulations of cumulative distribution functions of the input transmit signal at different total variance values.

3. The method of claim 1, wherein the total variance of the input signal is based at least on the individual channel gains of the spread spectrum channels.

4. The method of claim 1, wherein approximating the total variance of the input transmit signal includes calculating $$\sigma_z^2 = g_1^2 \sigma_1^2 + g_2^2 \sigma_2^2 + \ldots + g_n^2 \sigma_n^2$$

where $\sigma_z^2$ is the total variance, $g_1, g_2, \ldots g_n$ are the individual channel gains, and $\sigma_1^2, \sigma_2^2, \ldots \sigma_n^2$ are the variances of the spread spectrum channels.

5. The method of claim 1, wherein the amplification function is a polynomial function of the total variance.

6. The method of claim 1, wherein the amplification function is a trigonometric function of the total variance.

7. The method of claim 1, wherein the amplification function is a lookup table.

8. The method of claim 1, wherein determining the amplification gain further comprises determining a peak amplitude level using the amplification function, the amplification gain being inversely proportional to the peak amplitude level.

9. A system for controlling the amplification gain of an input transmit signal in order to operate a radio transmitter at a desired cumulative distribution level, the input transmit signal including a plurality of spread spectrum channels, the spread spectrum channels having individual channel gains, the system comprising:

an amplifier inputting the input transmit signal and outputting an amplified transmit signal, the amplifier configured to amplify the input transmit signal in response to a gain control signal;

a digital-to-analog converter coupled to the amplified transmit signal; and a gain control unit coupled to the gain control signal, the gain control unit configured to approximate a total variance of the input signal and to adjust the gain control signal based on an amplification function dependent on the total variance of the input transmit signal.

10. The system of claim 9, wherein the amplification function is derived from simulations of cumulative distribution functions of the input transmit signal at different total variance values.

11. The system of claim 9, wherein the total variance of the input signal is based at least on the individual channel gains of the spread spectrum channels.

12. The system of claim 9, wherein the total variance of the input signal is approximated by calculating $$\sigma_z^2 = g_1^2 \sigma_1^2 + g_2^2 \sigma_2^2 + \ldots + g_n^2 \sigma_n^2$$

where $\sigma_z^2$ is the total variance, $g_1, g_2, \ldots g_n$ are the individual channel gains, and $\sigma_1^2, \sigma_2^2, \ldots \sigma_n^2$ are the variances of the spread spectrum channels.

13. The system of claim 9, wherein the amplification function is a polynomial function of the total variance.

14. The system of claim 9, wherein the amplification function is a trigonometric function of the total variance.

15. A computer program product embodied in a tangible media comprising:

computer readable program codes coupled to the tangible media for controlling amplification of an input transmit signal coupled to a digital-to-analog converter in a transmitter in order to operate the digital-to-analog converter such that its clipping point corresponds to a desired cumulative distribution level, the input transmit signal including a plurality of spread spectrum channels, the spread spectrum channels having individual channel gains, the computer readable program codes configured to cause the program to:

approximate a total variance of the input transmit signal; and determine an amplification gain corresponding to the desired cumulative distribution level using an amplification function dependent on the total variance of the input transmit signal.

16. The computer program product of claim 15, wherein the amplification function is derived from simulations of cumulative distribution functions of the input transmit signal at different total variance values.

17. The computer program product of claim 15, wherein the total variance of the input signal is based at least on the individual channel gains of the spread spectrum channels.

18. The computer program product of claim 15, wherein the computer readable program code configured to cause the program to approximate the total variance of the input transmit signal includes computer readable program code configured to cause the program to calculate $$\sigma_z^2 = g_1^2 \sigma_1^2 + g_2^2 \sigma_2^2 + \ldots + g_n^2 \sigma_n^2$$

where $\sigma_z^2$ is the total variance, $g_1, g_2, \ldots \sigma_n$ are the individual channel gains, and $\sigma_1^2, \sigma_2^2, \ldots \sigma_n^2$ are the variances of the spread spectrum channels.

19. The computer program product of claim 15, wherein the amplification function is a polynomial function of the total variance.

20. The computer program product of claim 15, wherein the amplification function is a trigonometric function of the total variance.

* * * * *